United States Patent
Chern

[19]

[11] Patent Number: 5,981,336
[45] Date of Patent: Nov. 9, 1999

[54] PROCESS FOR FORMING DOUBLE-LAYER CROWN CAPACITOR

[75] Inventor: Horng-Nan Chern, Hsinchu Hsien, Taiwan

[73] Assignee: Powerchip Semiconductor Corp., Taiwan

[21] Appl. No.: 08/999,116

[22] Filed: Dec. 29, 1997

[51] Int. Cl.$^6$ .............................................. H01L 21/8242
[52] U.S. Cl. ............................................ 438/253; 438/634
[58] Field of Search ................................... 438/253, 254, 438/396, 397, 634, 657

[56] References Cited

U.S. PATENT DOCUMENTS

| | | | |
|---|---|---|---|
| 5,807,775 | 9/1998 | Tseng | 438/254 |
| 5,811,331 | 9/1998 | Ying et al. | 438/253 |
| 5,824,591 | 10/1998 | Sakoh | 438/253 |

OTHER PUBLICATIONS

Watanabe et al., "A New Cylindrical Capacitor . . . ", IEEE (1992) 10.1.1–10.1.4.

*Primary Examiner*—Chandra Chaudhari
*Attorney, Agent, or Firm*—Chapman and Cutler

[57] ABSTRACT

A process for forming a double-layer crown capacitor is provided for increasing the surface area of the capacitor and is applied to a memory unit. The process includes: a) forming a contact window, b) forming a first conducting layer, c) forming a second insulator over the first conducting layer, d) forming a second conducting layer, e) forming a third insulator, f) removing portions of the third insulator and the second conducting layer for exposing a part of the second conducting layer to form a masking layer, g) removing another portion of the third insulator and portions of the second insulator and the first conducting layer, h) removing another portion of the second conducting layer and a portion of the second insulator not covered by the masking layer, i) forming spacers alongside the masking layer and another portion of the second insulator, and removing the masking layer and the another portion of the second insulator for defining a first capacitor by the spacers and another portion of the first conducting layer, j) forming a dielectrical layer, and k) forming a third conducting layer to serve as a second capacitor.

25 Claims, 7 Drawing Sheets

5,981,336

PROCESS FOR FORMING DOUBLE-LAYER CROWN CAPACITOR

FIELD OF THE INVENTION

The present invention is related to a process for manufacturing a capacitor, and especially to a process for forming a double-layer crown capacitor applied to a memory unit.

BACKGROUND OF THE INVENTION

The capacity of a capacitor is related to the quality of dynamic random access memory (DRAM). The conventional simple plannar-typed capacitor is not good enough to meet the requirement of high density of DRAM. Therefore, a process for manufacturing a single-layer crown capacitor through the formation of a single insulator and a spacer is adopted in order to increase the capacity of capacitor. For example, H. Watanabe, et al. has proposed a process for forming a single-layer crown capacitor (A new cylindrical capacitor using hemispherical grained Si (HSG-Si) for 256 Mb DRAMs. (1992) IEEE). Please refer to FIG. 1 showing this process. It is briefly described as follows:

In FIG. 1 (a), a silicon dioxide layer 2 is formed over an insulator 1 (e.g. borophosphosilicate glass (BPSG) layer) by chemical vapor deposition (CVD) and then a contact window is formed in the insulator 1 and the silicon dioxide layer 2 by photolithography and etching techique. Thereafter, a polysilicon layer is formed over the contact window and the silicon dioxide layer 2 by CVD and then the polysilicon layer is partially removed by etch back to form a contact plug 31 in the contact window.

The steps shown in FIG. 1 (b) include: (1) a p-doped amorphous-Si layer is formed over the silicon dioxide layer 2 and the contact plug 31 by CVD; (2) another insulator (e.g. phosphosilicate glass (PSG) layer or a borophosphosilicate glass layer) is formed over the p-doped amorphous-Si layer by CVD; (3) portions of the p-doped amorphous-Si layer and the another insulator are removed by photolithography and etching techique while retaining the defined p-doped amorphous-Si layer 41 and another insulator 51 for forming a lower capacitor plate of the single-layer crown capacitor.

In FIG. 1 (c), another p-doped amorphous-Si layer is formed on a portion of the silicon dioxide layer 2 and the another insulator 51 as well as alongside the p-doped amorphous-Si layer 41 and the another insulator 51 by CVD. Thereafter, the another p-doped amorphous-Si layer is partially removed by dry etching while retaining a portion of the p-doped amorphous-Si layer 42 alongside the amorphous-Si layer 41 and the another insulator 51.

FIG. 1 (d) shows a step to remove the another insulator 51 by wet etching.

The steps shown in FIG. 1 (e) include: (1) a polysilicon layer is formed on a portion of the silicon dioxide layer 2 and the amorphous-Si layers 41, 42 by CVD at 560~580° C.; (2) the polysilicon layer is processed through an anealing procedure for forming a hemispherical grained Si (HSG) to increase the surface area of the capacitor; and (3) the hemispherical grained Si is partially removed while retaining the defined hemispherical grained Si 61. Thus, the amorphous-Si layers 41, 42, the contact plug 31, and the hemispherical grained Si 61 serve as a lower capacitor plate of the single-layer crown capacitor.

In FIG. 1 (f), a dielectric layer 7 (e.g. oxide-nitride-oxide (ONO) layer) is formed over a portion of the silicon dioxide layer 2 and the hemispherical grained Si 61 by chemical vapor deposition and then a polysilicon layer 8 is formed over the dielectric layer 7 by chemical vapor deposition, wherein the polysilicon layer 8 serves as an upper capacitor plate of the single-layer crown capacitor.

However, this kind of the single-layer crown capacitor is still not good enough to solve the problem of insufficient capacitance of DRAM in the future.

SUMMARY OF THE INVENTION

An object of the present invention is to provide a process for increasing the capacitance of DRAM.

Another object of the present invention is to provide a process for forming a double-layer crown capacitor applied to a memory unit.

According to the present invention, the process includes: a) forming a contact window on the first insulator of the memory unit; b) forming a first conducting layer over the contact window and on the first insulator; c) forming a second insulator over the first conducting layer; d) forming a second conducting layer over the second insulator; e) forming a third insulator over the second conducting layer; f) removing portions of the third insulator and the second conducting layer for exposing a part of the second conducting layer to form a masking layer; g) removing another portion of the third insulator and portions of the second insulator and the first conducting layer; h) removing another portion of the second conducting layer and a portion of the second insulator not covered by the masking layer; i) forming spacers alongside the masking layer and another portion of the second insulator, and removing the masking layer and the another portion of the second insulator for defining a first capacitor by the spacers and another portion of the first conducting layer; j) forming a dielectrical layer on the first capacitor; and k) forming a third conducting layer over the dielectrical layer to serve as a second capacitor.

In accordance with one aspect of the present invention, the memory unit is a dynamic random access memory (DRAM).

In accordance with another aspect of the present invention, the first insulator is one selected from a group consisting of a silicon dioxide ($SiO_2$) layer, a silicon nitride ($Si_3N_4$) layer, a silicon-oxy-nitride (SiOxNy) layer, a phosphosilicate glass (PSG) layer and a borophosphosilicate glass (BPSG) layer.

In accordance with another aspect of the present invention, the first insulator is a dielectric layer formed by using one of tetra-ethyl-ortho-silane (TEOS) and silane ($SiH_4$) as a gas source.

In accordance with another aspect of the present invention, the first insulator is formed by chemical vapor deposition (CVD).

In accordance with another aspect of the present invention, the contact window of the step (a) is formed by photolithography and etching techique.

In accordance with another aspect of the present invention, the first conducting layer of the step (b) is one of a polysilicon layer and an n+ type doped polysilicon layer.

In accordance with another aspect of the present invention, the first conducting layer of the step (b) is formed by chemical vapor deposition (CVD) and has a thickness ranged from 5000Å to 10000Å.

In accordance with another aspect of the present invention, the second insulator of the step (c) is a silicon nitride ($Si_3N_4$) layer formed by chemical vapor deposition (CVD).

In accordance with another aspect of the present invention, the second conducting layer of the step (d) is a thin polysilicon layer formed by chemical vapor deposition (CVD) and has a thickness less than 500Å.

In accordance with another aspect of the present invention, the third insulator of the step (e) is a silicon nitride ($Si_3N_4$) layer formed by chemical vapor deposition (CVD).

In accordance with another aspect of the present invention, the process further includes, between the steps (e) and (f), steps of: e1) forming a photoresist over the third insulator; and e2) executing photolithography and etching techique to remove a portion of the photoresist for retaining a defined portion of the photoresist.

In accordance with another aspect of the present invention, the process further includes, between the steps (f) and (g), steps of: f1) removing the defined portion of the photoresist.

In accordance with another aspect of the present invention, the portion of the third insulator of the step (f) is removed by wet etching or dry etching.

In accordance with another aspect of the present invention, the masking layer of the step (f) is a polyoxide formed from the oxidation of the exposed part of the second conducting layer.

In accordance with another aspect of the present invention, in the step (g), the another portion of the third insulator and the portions of the second insulator and the first conducting layer are removed by dry etching.

In accordance with another aspect of the present invention, in the step (h), the another portion of the second conducting layer and the portion of the insulator not covered by the masking layer are removed by dry etching.

In accordance with another aspect of the present invention, the step (i) further includes: i1) forming a fourth conducting layer on the masking layer, another portion of the first conducting layer and a portion of the first insulator, and alongside the another portion of the second insulator; and i2) removing the masking layer, the another portion of the second insulator, and a portion of the fourth conducting layer on the first insulator for forming the spacers.

In accordance with another aspect of the present invention, the fourth conducting layer is a polysilicon layer formed by chemical vapor deposition (CVD).

In accordance with another aspect of the present invention, the masking layer and the another portion of the second insulator are removed by wet etching.

In accordance with another aspect of the present invention, the portion of the fourth conducting layer is removed by etch back.

In accordance with another aspect of the present invention, in the step (j), the dielectric layer is one selected from a group consisting of layers of nitride, oxide-nitride (ON), nitride-oxide (NO), oxide-nitride-oxide (ONO), and oxide-nitride-oxide-nitride (ONON).

In accordance with another aspect of the present invention, in the step (j), the dielectric layer is a layer selected from a group consisting of tantalum oxide ($Ta_2O_5$), lead-zinc teleride (PZT) and barium-stronsium tantanite (BST).

In accordance with another aspect of the present invention, in the step (j), the dielectric layer is formed by chemical vapor deposition (CVD) and has a thickness ranged from 30Å to 5000Å.

In accordance with another aspect of the present invention, in the step (k), the third conducting layer is a polysilicon formed by chemical vapor deposition (CVD).

The present invention may best be understood through the following description with reference to the accompanying drawings, in which:

DETAILED DESCRIPTION OF THE PREFERRED EMBODIMENT

Figure 1A:
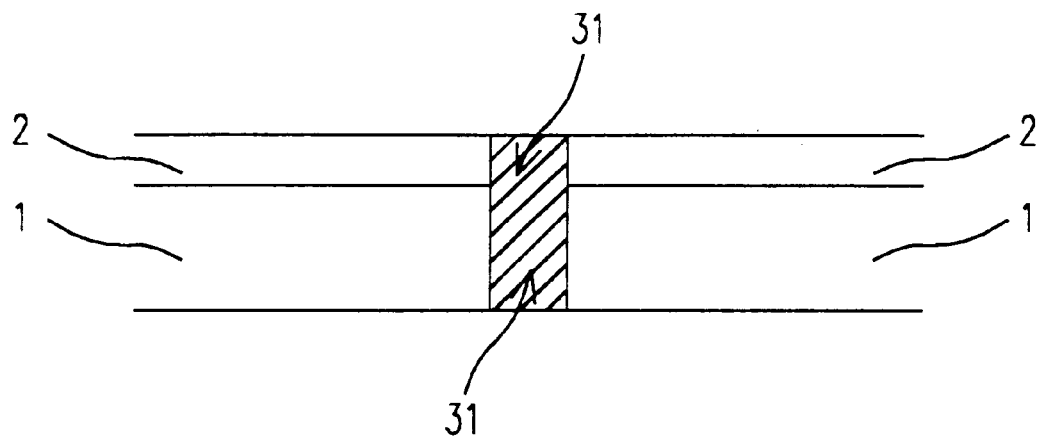
FIG. 1 (a)~(f) are schematic diagrams showing a conventional process for forming a single-layer crown capacitor.
Figure 1B:
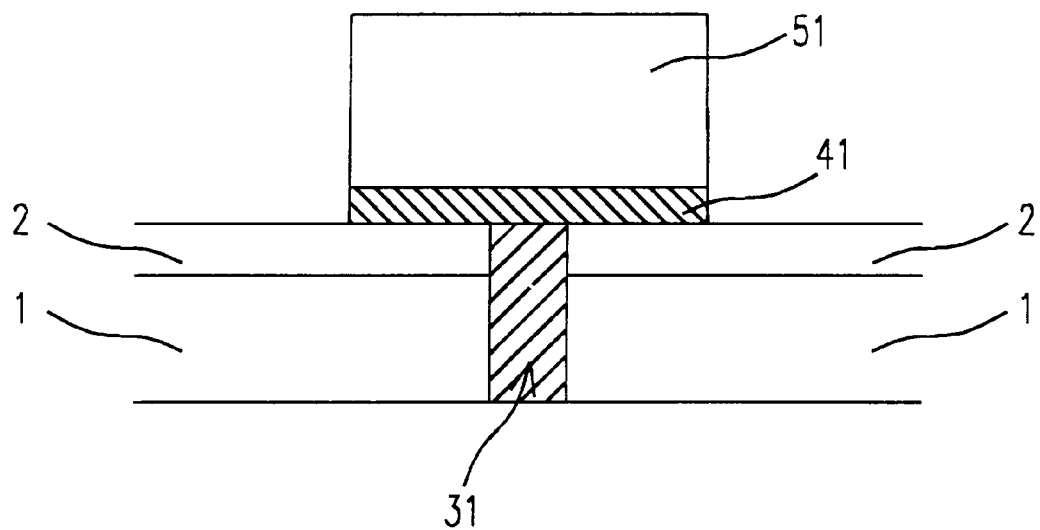
Figure 1C:
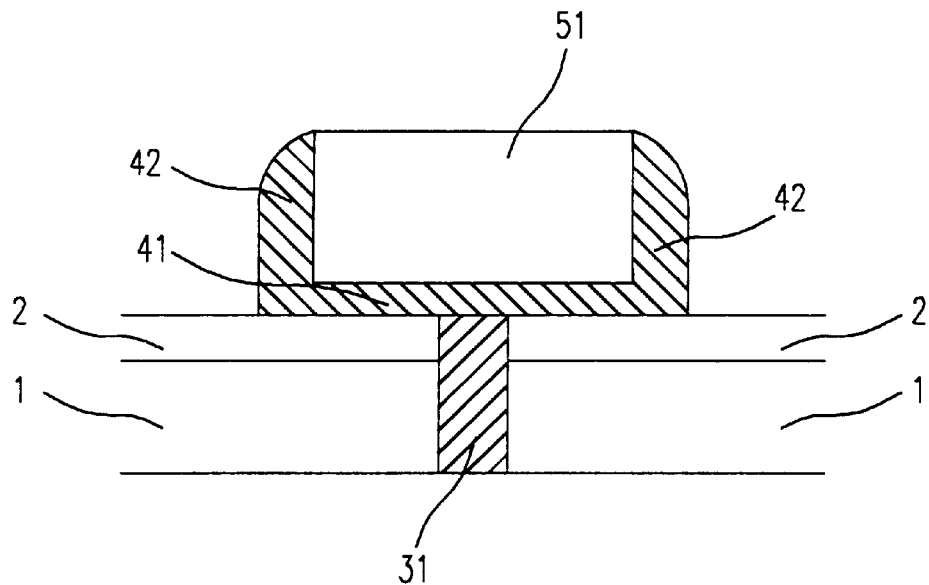
Figure 1D:
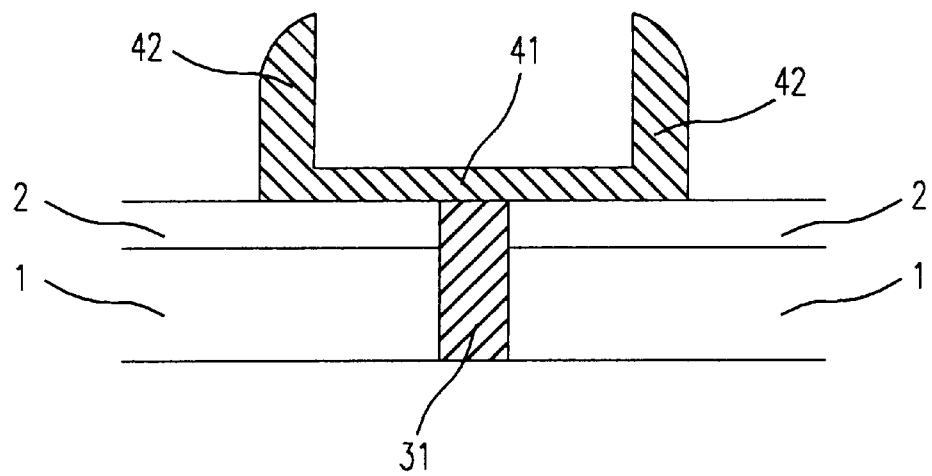
Figure 1E:
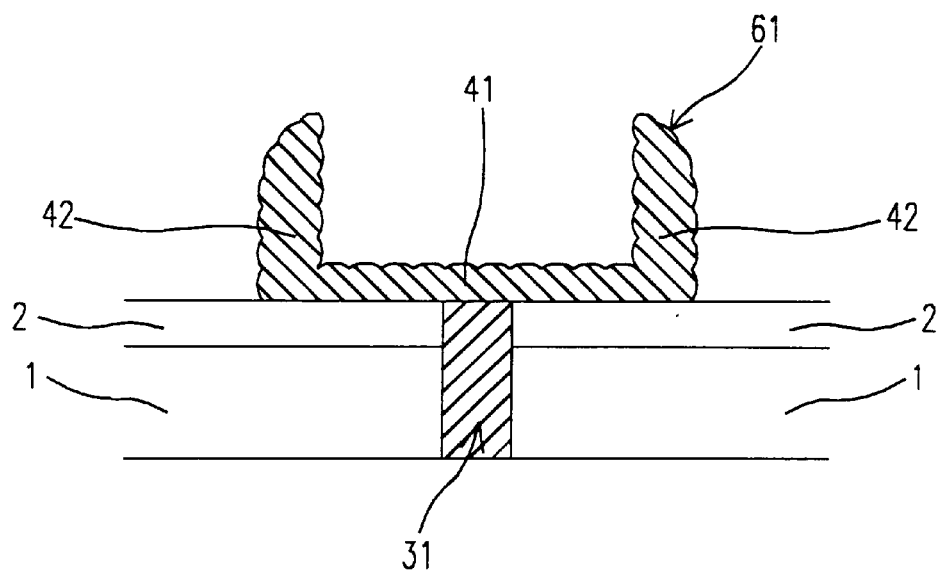
Figure 1F:
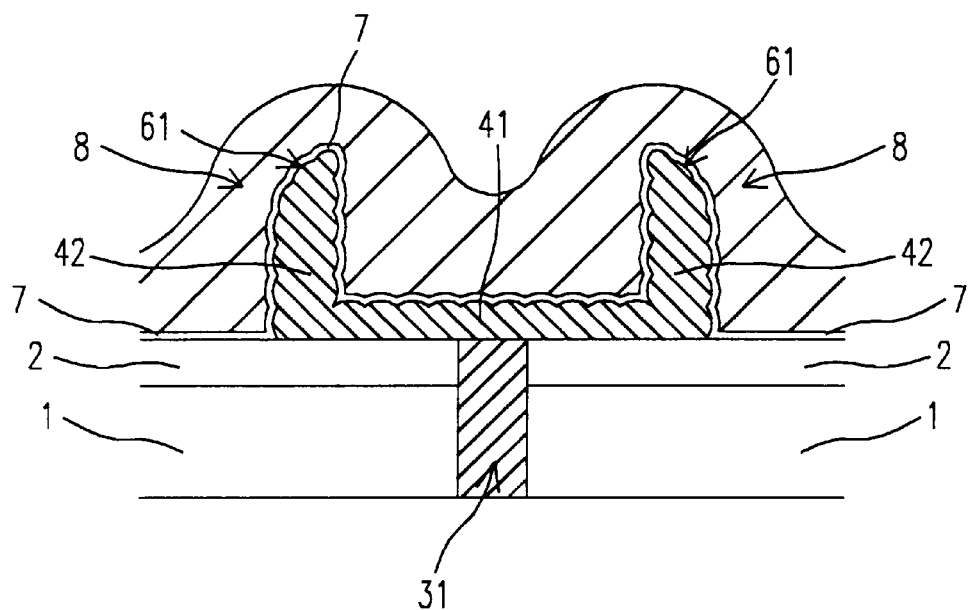
Figure 2A:
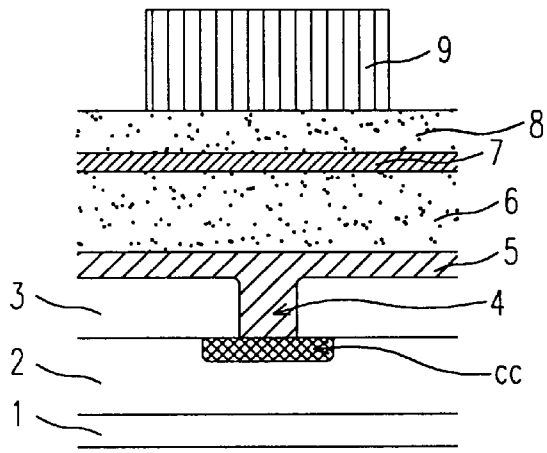
FIG. 2 (a)~(m) are schematic diagrams showing a preferred embodiment of the process for forming a double-layer crown capacitor according to the present invention.
Figure 2B:
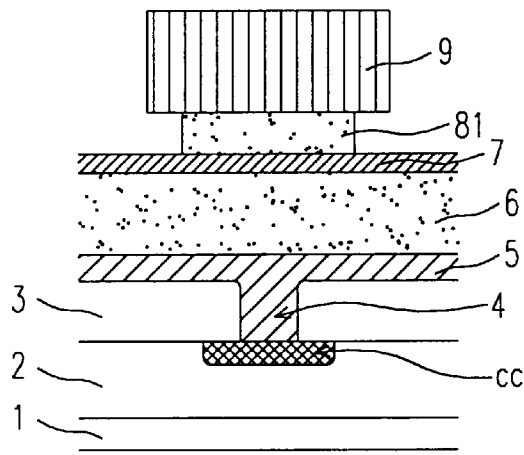
Figure 2C:
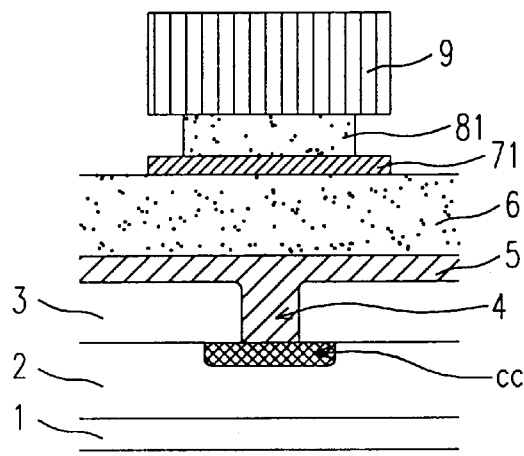
Figure 2D:
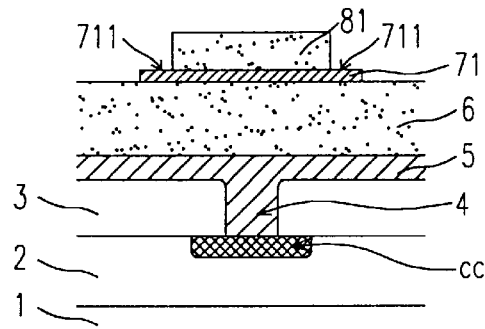
Figure 2E:
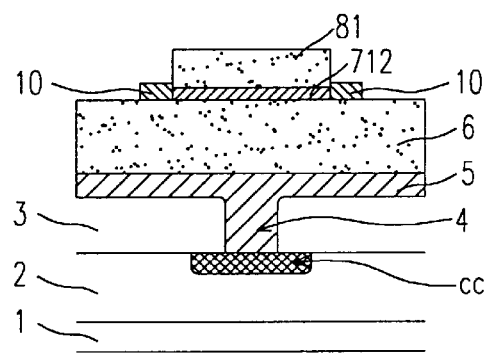
Figure 2F:
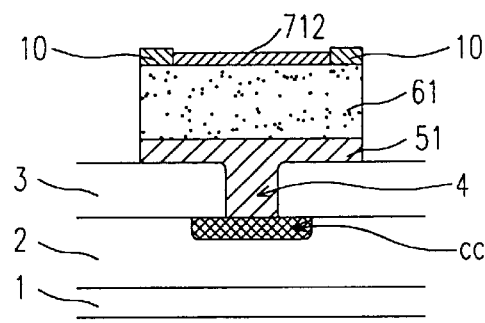
Figure 2G:
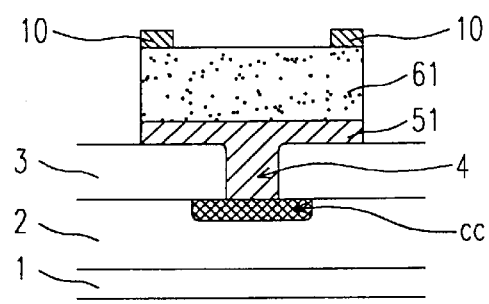
Figure 2H:
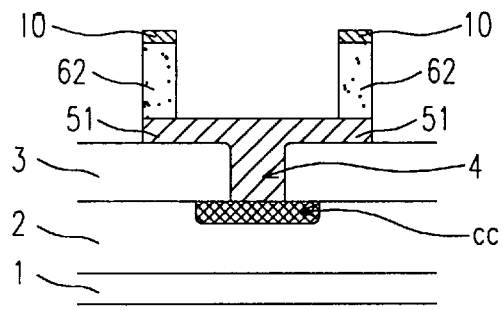
Figure 2I:
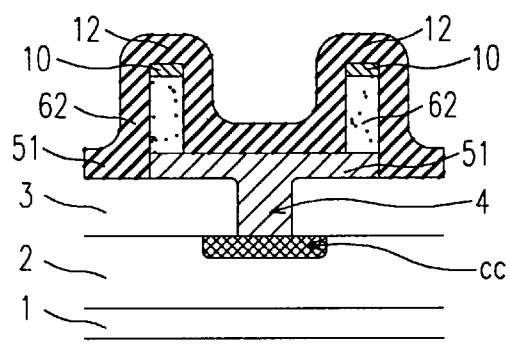
Figure 2J:
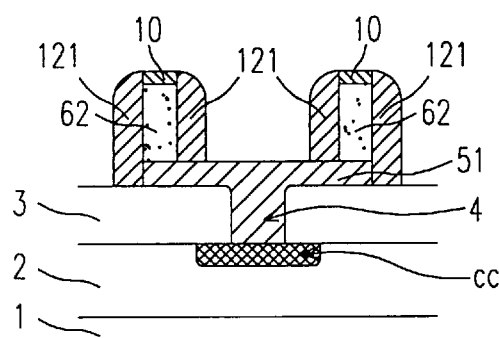
Figure 2K:
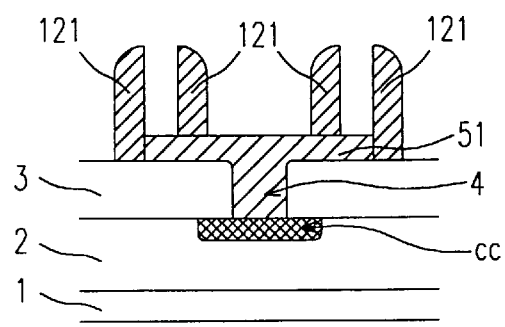
Figure 2L:
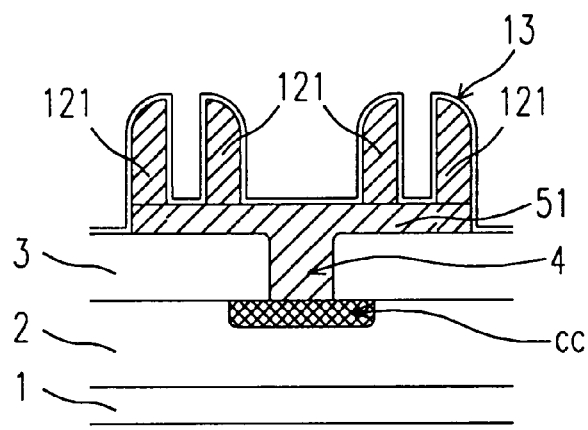
Figure 2M:
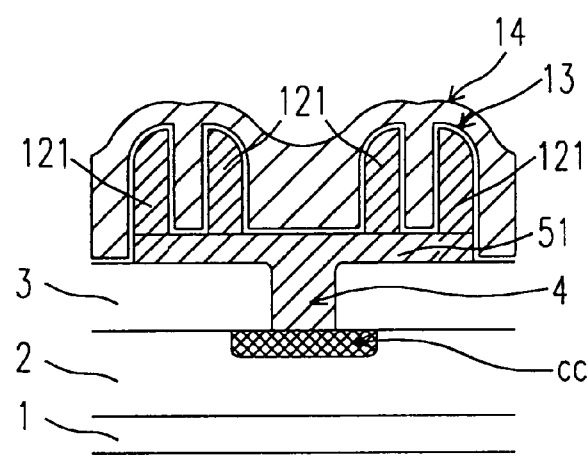

Please refer to FIG. 2 (a)~(m) showing a preferred embodiment of the process for forming a double-layer crown capacitor of the present invention. The detailed process is described as follows.

In FIG. 2 (a), a device 2 is formed on a sillicon substrate 1 and then a first insulator 3 is formed on the device 2 by chemical vapor deposition (CVD). The first insulator 3 is one selected from a group consisting of a silicon dioxide ($SiO_2$) layer, a silicon nitride ($Si_3N_4$) layer, a silicon-oxy-nitride (SiOxNy) layer, a phosphosilicate glass (PSG) layer and a borophosphosilicate glass (BPSG) layer. Preferably, the first insulator 3 can be a dielectric layer formed by using tetra-ethyl-ortho-silane (TEOS) or silane ($SiH_4$) as a gas source. Thereafter, a contact window 4 is formed in the first insulator 3 for exposing a cell contact cc of the device 2 by photolithography and etching techique.

Certainly, the silicon substrate 1, the device 2, and the first insulator 3 are all included in the memory unit. Preferably, the memory unit is a dynamic random access memory (DRAM).

In addition, a first conducting layer 5 is formed over the contact window 4 and on the first insulator 3 by CVD, wherein the first conducting layer 5 can be an n+ type doped polysilicon layer and has a thickness ranged from 5000Å to 10000Å.

Thereafter, a second insulator 6 is formed over the first conducting layer 5 by chemical vapor deposition and then a second conducting layer 7 is formed over the second insulator by chemical vapor deposition, wherein the second conducting layer 7 can be a thin polysilicon layer with a thickness less than 500Å.

Thenceforce, a third insulator 8 is formed over the second conducting layer 7 by CVD and then a photoresist is formed over the third insulator 8. After this, a portion of the photoresist is removed by photolithography and etching techique while retaining a defined portion of the photoresist 9.

In FIG. 2 (b), a portion of the third insulator 8 is removed by wet etching while retaining another portion of the third insulator 81.

In FIG. 2 (c), a portion of the second conducting layer 7 is removed by dry etching while retaing another portion of the second conducting layer 71. The another portion of the third insulator 81 is smaller than that of the second conducting layer 71.

In FIG. 2 (d), the defined portion of the photoresist 9 is removed by wet etching or dry etching for exposing a portion 711 of the second conducting layer 71.

In FIG. 2 (e), the portion 711 of the second conducting layer 71 not covered by the another portion of the third insulator 81 is oxidized to form a polyoxide serving as a masking layer 10. Certainly, another portion of the second conducting layer 712 covered by the another portion of the third insulator 81 can not be oxidized.

In FIG. 2 (f), the another portion of the third insulator 81 and portions of the second insulator 6 and the first conducting layer 5 are removed by dry etching while retaining another portions of the second insulator 61 and the first conducting layer 51.

In FIG. 2 (g), the another portion of the second conducting layer 712 is removed by dry etching for partially exposing the another portion of the second insulator 61.

In FIG. 2 (h), the exposed part of the another portion of the second insulator 61 is removed by dry etching while retaining the part of the second insulator 62 covered by the masking layer 10.

In FIG. 2 (i), a third conducting layer 12 is formed on the masking layer 10, the another portion of the first conducting layer 51 and a portion of the first insulator 3, and alongside the part of the second insulator 62 by CVD. The third conducting layer 12 can be a polysilicon layer.

In FIG. 2 (j), a portion of the third conducting layer on the top of the masking layer 10 and portions of the first conducting layer 51 and the first insulator 3 are removed by etch back for forming spacers 121.

In FIG. 2 (k), the masking layer 10 and the part of the second insulator 62 are removed by wet etching for defining a first capacitor (e.g. a lower capacitor plate) by the spacers 121 and the portion of the first conducting layer 51. Certainly, the formation of the spacers 121 is used to be a means for forming a double-layer crown capacitor.

In FIG. 2 (l), a dielectrical layer 13 is formed over the spacers 121 and the portion of the first conducting layer 51 by chemical vapor deposition. Preferably, the dielectric layer 13 is one selected from a group consisting of layers of nitride, oxide-nitride (ON), nitride-oxide (NO), oxide-nitride-oxide (ONO), and oxide-nitride-oxide-nitride (ONON). Certainly, the dielectric layer 13 can be a layer selected from a group consisting of tantalum oxide ($Ta_2O_5$), lead-zinc teleride (PZT) and barium-stronsium tantanite (BST). The thickness of the dielectric layer 13 is ranged from 30Å to 5000Å.

In FIG. 2 (m), a fourth conducting layer 14 is formed over the dielectrical layer 13 by chemical vapor deposition to serve as a second capacitor (e.g. an upper capacitor plate). Preferably, the fourth conducting layer 14 is a polysilicon layer formed by chemical vapor deposition (CVD).

According to the present invention, the process for forming a double-layer crown capacitor can greatly increase the surface area of the capacitor to solve the problem of insufficient capacitance of the conventional capacitor.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A process for forming a double-layer crown capacitor applied to a memory unit having a substrate forming thereon a device forming thereon a first insulator comprising steps of:

a) forming a contact window on said first insulator;
b) forming a first conducting layer over said contact window and on said first insulator;
c) forming a second insulator over said first conducting layer;
d) forming a second conducting layer over said second insulator;
e) forming a third insulator over said second conducting layer;
f) removing portions of said third insulator and said second conducting layer for exposing a part of said second conducting layer to form a masking layer;
g) removing another portion of said third insulator and portions of said second insulator and said first conducting layer;
h) removing another portion of said second conducting layer and a portion of said second insulator not covered by said masking layer;
i) forming spacers alongside said masking layer and another portion of said second insulator, and removing said masking layer and said another portion of said second insulator for defining a first capacitor by said spacers and another portion of said first conducting layer;
j) forming a dielectrical layer on said first capacitor; and
k) forming a third conducting layer over said dielectrical layer to serve as a second capacitor.

2. A process as claimed in claim 1, wherein said memory unit is a dynamic random access memory (DRAM).

3. A process as claimed in claim 1, wherein said first insulator is one selected from a group consisting of a silicon dioxide ($SiO_2$) layer, a silicon nitride ($Si_3N_4$) layer, a silicon-oxy-nitride (SiOxNy) layer, a phosphosilicate glass (PSG) layer and a borophosphosilicate glass (BPSG) layer.

4. A process as claimed in claim 1, wherein said first insulator is a dielectric layer formed by using one of tetra-ethyl-ortho-silane (TEOS) and silane ($SiH_4$) as a gas source.

5. A process as claimed in claim 1, wherein said first insulator is formed by chemical vapor deposition (CVD).

6. A process as claimed in claim 1, wherein said contact window of said step (a) is formed by photolithography and etching techique.

7. A process as claimed in claim 1, wherein said first conducting layer of said step (b) is one of a polysilicon layer and an n+ type doped polysilicon layer.

8. A process as claimed in claim 1, wherein said first conducting layer of said step (b) is formed by chemical vapor deposition (CVD) and has a thickness ranged from 5000Å to 10000Å.

9. A process as claimed in claim 1, wherein said second insulator of said step (c) is a silicon nitride ($Si_3N_4$) layer formed by chemical vapor deposition (CVD).

10. A process as claimed in claim 1, wherein said second conducting layer of said step (d) is a thin polysilicon layer formed by chemical vapor deposition (CVD) and has a thickness less than 500Å.

11. A process as claimed in claim 1, wherein said third insulator of said step (e) is a silicon nitride ($Si_3N_4$) layer formed by chemical vapor deposition (CVD).

12. A process as claimed in claim 1 further including between said steps (e) and (f) steps of:
e1) forming a photoresist over said third insulator; and
e2) executing photolithography and etching techique to remove a portion of said photoresist for retaining a defined portion of said photoresist.

13. A process as claimed in claim 12 further including between said steps (f) and (g) steps of:

f1) removing said defined portion of said photoresist.

14. A process as claimed in claim 1, wherein said portion of said third insulator of said step (f) is removed by one of wet etching and dry etching.

15. A process as claimed in claim 1, wherein said masking layer of said step (f) is a polyoxide formed from an oxidation of said exposed part of said conducting layer.

16. A process as claimed in claim 1, wherein in said step (g), said another portion of said third insulator and said portions of said second insulator and said first conducting layer are removed by dry etching.

17. A process as claimed in claim 1, wherein in said step (h), said another portion of said second conducting layer and said portion of said insulator not covered by said masking layer are removed by dry etching.

18. A process as claimed in claim 1, wherein said step (i) further includes:

i1) forming a fourth conducting layer on said masking layer, another portion of said first conducting layer and a portion of said first insulator, and alongside said another portion of said second insulator; and i2) removing said masking layer, said another portion of said second insulator, and a portion of said fourth conducting layer on said first insulator for forming said spacers.

19. A process as claimed in claim 18, wherein said fourth conducting layer is a polysilicon layer formed by chemical vapor deposition (CVD).

20. A process as claimed in claim 18, wherein said masking layer and said another portion of said second insulator are removed by wet etching.

21. A process as claimed in claim 18, wherein said portion of said fourth conducting layer is removed by etch back.

22. A process as claimed in claim 1, wherein in said step (j), said dielectric layer is one selected from a group consisting of layers of nitride, oxide-nitride (ON), nitride-oxide (NO), oxide-nitride-oxide (ONO), and oxide-nitride-oxide-nitride (ONON).

23. A process as claimed in claim 1, wherein in said step (j), said dielectric layer is a layer selected from a group consisting of tantalum oxide ($Ta_2O_5$), lead-zinc teleride (PZT) and barium-stronsium tantanite (BST).

24. A process as claimed in claim 1, wherein in said step (j), said dielectric layer is formed by chemical vapor deposition (CVD) and has a thickness ranged from 30Å to 5000Å.

25. A process as claimed in claim 1, wherein in said step (k), said third conducting layer is a polysilicon formed by chemical vapor deposition (CVD).

* * * * *